Dec. 17, 1968 H. G. CARTER, JR., ET AL 3,416,348

FLAT-PACK LEAD BENDING DEVICE

Filed Sept. 30, 1966

United States Patent Office 3,416,348

Patented Dec. 17, 1968

3,416,348

FLAT-PACK LEAD BENDING DEVICE

Henry G. Carter, Jr., Severna Park, and John H. Gifford, Laurel, Md., assignors to Westinghouse Electric Corporation, Pittsburgh, Pa., a corporation of Pennsylvania Filed Sept. 30, 1966, Ser. No. 583,337
4 Claims. (Cl. 72—220)

The present invention relates to a device for bending leads of a flat-pack microcircuit module, and more particularly to such a device for the simultaneous bending of a plurality of such leads on a given module.

Integrated circuits packaged in the flat-pack configuration have rectangular ribbon output leads exiting from the thin edges of an hermetically sealed case. These leads pass through the wall of the case, which often is of glass, and are internally connected to the molecular circuit chip within the case. When preparing the flat-packs for assembly onto a printed circuit board it is necessary to bend the leads to a 90° angle with respect to the case so that they can be inserted through the predrilled holes in the board. Since the mounting holes occupy precise locations and often are staggered, the bending of the flat-pack module leads tends to become a tedious task when considering the relatively small size of such modules and the possibility of destroying the hermetic seal where the lead passes through the wall of the case, which could result in degradation of reliability of the module in use.

In accordance with the foregoing, it becomes a prime object of the present invention to provide a device for bending the leads of a flat-pack module in such a manner that the leads are bent at precise locations, with facility, and without destroying the hermetic seal where the lead passes through the wall of the case of such modules.

In accord with the general features of the present invention the device thereof includes a fixed member onto which a flat-pack module may be placed and located such that the leads thereof extend beyond lead-support surfaces on top of such member, a clamping member for holding the portions of such leads adjacent to the module case against the lead-support surfaces of such fixed member, and a bending roller means which is advanced downwardly against the projecting portions of the leads while held by the clamping member to force such leads downwardly along lead-forming surfaces at the side edges of the fixed member. By one bending roller all of the leads at one side of the flat-pack module may be bent simultaneously, and by providing a dual-roller arrangement the simultaneous bending of the leads at both sides of a flat-pack module may be effected simultaneously.

Other objects, features, and advantages of the invention will become apparent from the following detailed description of an illustrative embodiment thereof when taken in connection with the accompanying drawings in which.

Figures 1, 2, 3, 4, 5, 6:
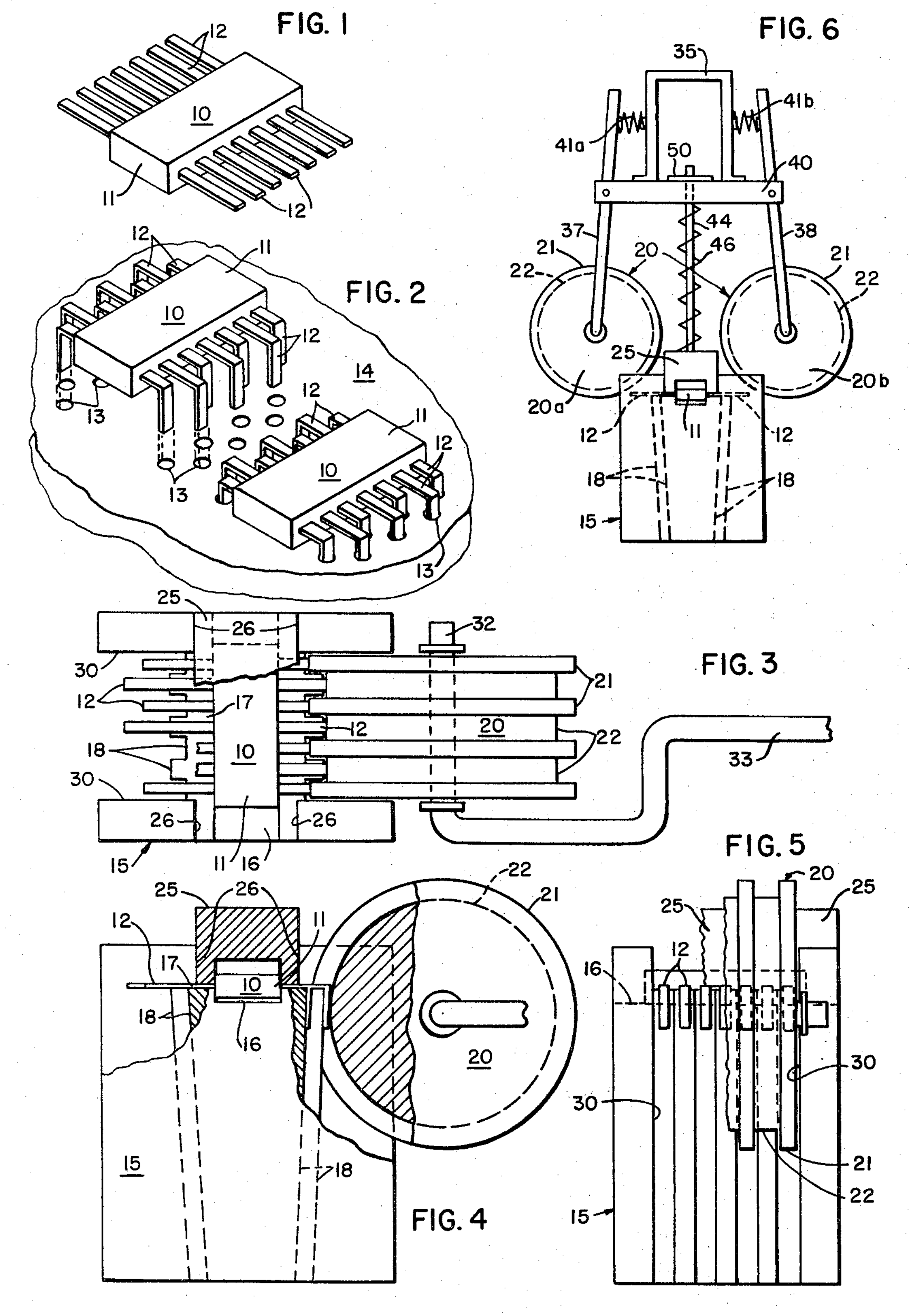
FIGURE 1 is an isometric view of a typical flat-pack microcircuit module prior to bending of its leads.
FIG. 2 is an isometric view of a fragment of a printed circuit board showing a typical arrangement of positioning and insertion of the bended leads of flat-pack circuit modules.
FIGS. 3, 4 and 5 are top, front and side views, respectively, of one embodiment of the present invention.
FIG. 6 is a front elevational view of an alternate embodiment of the present invention.

Referring to FIG. 1, the usual flat-pack microcircuit module 10 with which the invention is to be employed comprises a flat, rectangular case 11, often of glass or ceramic material, containing a molecular circuit chip (not shown) to which are electrically connected a plurality of rectangular ribbon output leads 12 which project from opposite thin edges of the case. When prepared for use on printed circuit boards, the leads 12 are bent at an angle of 90° with respect to the case and these leads are then inserted into pre-drilled holes 13 in a printed circuit board 14, as shown in FIG. 2. Bending of the leads can be accomplished by gripping each lead in turn with a pair of pliers and then making the bend with another pair of pliers. However, flat-pack leads are relatively fragile and it is impossible to control this delicate pliers-bending operation to such an extent that uniformity of pattern will result from lead-to-lead and package-to-package. In high density assemblies using packaging techniques where all clearances are designed minimal, uniformity of parts conforming to a pre-established pattern is essential. In addition, the bending of leads one at a time is time consuming and costly. Furthermore, often the mounting holes in a printed circuit board are relatively large in relation to their spacing and cannot be placed "in-line" and are therefore staggered. This means that the bends in the leads also must be staggered, as shown in FIG. 2, for example, which further complicates the matter of bending such leads.

Referring to FIGS. 3, 4 and 5, the embodiment of the invention illustrated therein comprises a fixed member 15 having a recess 16 at its upper surface to accommodate disposition of the case 11 of a flat-pack module 10 while its leads 12 rest on and project beyond lead-support surfaces 17 at opposite sides of the recess. The outer edges of the lead-support surfaces 17 intersect downwardly-extending lead-forming surfaces 18, at opposite sides of the member 15 and the location of such intersection away from the edge of the recess 16 determines the location where bending of the leads will occur. In the illustrative embodiment these intersections are of two different lengths and arranged in staggered or interleaved arrangement to provide the staggered lead bending arrangement illustrated in FIG. 2. To produce the bending while the leads 12 are resting on the support surfaces 18 and projecting therebeyond, a bending roller means 20 is provided which has coaxial circumferential surfaces 21 and 22 at two different radii coresponding to the two different staggered bend locations desired in the present instance, while the leads 12 thus project beyond the lead-support surfaces, the roller means 20 is introduced downwardly into contact therewith to cause the leads to be deflected downwardly into engagement with the lead-forming surfaces 18. Following this, the bending roller means 20 is removed and the leads 12 will maintain a permanent bend. The lead-forming surfaces 18 may be slightly undercut, i.e., extend slightly inward as well as downward to compensate for a slight tendency for the leads 12, after being bent by the roller means 20, to spring back a certain extent.

The device also includes a lead-clamping member 25 of inverted U-shape in cross section which straddles the case 11 of the flat-pack module 10 disposed in and projecting above the recess 16 and clamps the leads 12 against the lead-supporting surfaces 17 in the immediate vicinity of such case to enable the roller means 20 to effectuate the bending of the projecting ends of the leads without tending to effect any local bending action in the immediate vicinity of the case which might disturb a hermetic seal between case and leads. To facilitate location of the lead-clamping member 25 its length is sufficient to extend beyond the length of the lead support surfaces 17 to a position at its opposite ends disposed between vertically extending guide shoulders 26 on the fixed member 15 and between which the lead-clamping member 25 can be inserted and removed by vertical motion.

The fixed member 25 also is provided with guide shoulders 30 for the bending roller 20. The shoulders 30 extend outwardly perpendicularly from the lead-forming surfaces 18 to cooperate slidably with the side edges of the roller. The guide shoulders 30 also extend upwardly from the top of the fixed member 15 to guide the roller downwardly into initial introduction to the projecting leads 12 of a flat-pack module 10 on top of such member.

In the embodiment shown in FIGS. 3 to 5 the roller means 20 may simply be in the form of a single roller mounted on an axle 32 which is provided with a handle 33 for manipulation of the roller first on the leads 12 at one side of the flat-pack 10 and then on the leads 12 at the other side of the flat-pack.

In the modification shown in FIG. 6, however, the roller means 20 includes two rollers, 20*a* and 20*b*, one for the leads 12 at one side of the flat-pack 10 and a second one for the leads 12 at the other side of the flat-pack. The two rollers are connected to a common actuator member or handle 35 through the medium of respective axles on which such rollers rotate, respective vertically-extending arms 37 and 38 which pivot about a horizontal member 40 at the upper ends of the arms biased by respective compression springs 41*a* and 41*b* to urge the rollers inwardly toward one another and hence toward the lead-forming surfaces 18 in the fixed member 15 as the rollers are moved downwardly thereacross.

In addition, the lead clamping member 25 is also affiliated with the operating handle 35 through the medium of the horizontal member 40 and a vertical guide rod means 44 attached to such lead-clamping member and extending slidably upward through an opening in the horizontal member. Interposed between the horizontal member 40 and the lead-clamping member 25 is a compression spring 46 which exerts a downward force on the lead-clamping member 25 during depression of the handle 35 while affording freedom for relative downward movement of the roller members 20*a* and 20*b* while such lead-clamping member remains in its clamping position against the leads 12 at the top of the fixed member 15.

Upon removal of the roller and clamping member assemblage the clamping member 25 is retained in place at the end of the guide rod by means of such as a keeper washer member 50 which prevents the spring 46 from withdrawing the guide rod 44 completely from the opening in which it slides.

In the fixed member 15, both embodiments, the width of the recess 16 is substantially the same as the width of the flat-pack module case 11 with which it is employed, to assure that the location of the bends in the flat-pack leads 12 will be somewhat precise. The dimensions ow the lead-support and the lead-forming surfaces 17 and 18 in the fixed member 15 are such as to give a reasonable degree of tolerance to placement of the flat-pack 10 onto the fixed member 15 in the longitudinal direction of the recess 16.

From the foregoing it will be apparent that the device of the present invention provides for the accurate and rapid bending of flat-pack microcircuit module leads.

What is claimed is:

1. A device for bending leads of a flat-pack microcircuit module having a flat rectangular case and a plurality of straight output leads in dual parallel arrays extending outwardly from opposite sides edges of such case, said device comprising, a fixed member having horizontal lead-support surfaces of a width less than the length of the flat-pack leads, a recess between such lead-support surfaces of a depth sufficient to accommodate a flat-pack case while its leads lie on and project beyond said lead-support surfaces and of a width substantially equal to that of said case, lead-forming surfaces extending downwardly from the outer ends of said lead-support surfaces, clamping-member guide shoulders beyond opposite ends of said lead-support surfaces and extending above and within the width span thereof at opposite sides of said recess, and bending-roller guide shoulders extending outwardly at opposite ends of said lead-forming surfaces and vertically therealong into extension above the plane of said lead-support surfaces; a lead-clamping member of inverted U-shape in cross section insertable downwardly between said clamping-member guide shoulders at its opposite ends into abutment with flat-pack leads lying on said lead-support surfaces, while straddling a flat-pack case from which such leads extend; and bending roller means insertable downwardly between the upper ends of said bending-roller guide shoulders into rolling engagement with ends of flat-pack leads projecting beyond said lead-support surfaces for deflection of such leads into progressive contact with said lead-forming surfaces.

2. The flat-pack lead-bending device of claim 1, wherein:

said lead-forming surfaces and the lead-contacting surfaces of said bending roller means have complementary grooves formed therein to effect different bend locations for certain leads of a flat-pack module with respect to other leads of such module.

3. The flat-pack lead-bending device of claim 1, wherein the downwardly-extending lead-forming surfaces also extend inwardly to a degree commensurate with spring-back of the module leads upon being freed from engagement by the bending roller means.

4. The flat-pack lead-bending device of claim 1, further comprising a vertically-movable actuator means common to both said lead-clamping member and said bending roller means and including yieldable force-applying means for both, said actuator means being so constructed and arranged as to permit operation of both the lead-clamping member and the bending roller means to be effectuated with a straight downward input motion.

References Cited

UNITED STATES PATENTS

| | | | |
|---|---|---|---|
| 2,420,119 | 5/1947 | Boehn et al. | 72—212 |
| 2,736,948 | 3/1956 | Barnes | 72—212 |
| 2,954,067 | 9/1960 | Hayden et al. | 72—220 |
| 3,267,716 | 8/1966 | Hales | 72—386 |

CHARLES W. LANHAM, *Primary Examiner.*

A. RUDERMAN, *Assistant Examiner.*

U.S. Cl. X.R.

72—381